(12) United States Patent
Osorio Dinis et al.

(10) Patent No.: US 10,701,801 B2
(45) Date of Patent: Jun. 30, 2020

(54) MULTIFUNCTIONAL TEXTILE SENSOR (71) Applicant: CONTINENTAL—INDUSTRIA TEXTIL DO AVE, S.A., Lousado (PT)

(72) Inventors: Eduardo Jorge Osorio Dinis, Oporto (PT); Manuel Joaquim Goncalves Pinheiro, Lousado (PT); Carla Marina Araujo Pires, Braga (PT); Joao Luís Neto Guimaraes Pereira, Lousado (PT); Ines Rocha e Silva Valente De Matos, Lousado (PT); Joao Manuel de Carvalho Gomes, Lousado (PT); Vasco Goncalves Pimenta Machado, Lousado (PT); Antonio Fernando California Marques, Lousado (PT); Jose Fernando Oliveira Da Silva, Lousado (PT)

(73) Assignee: CONTINENTAL—INDUSTRIA TEXTIL DO AVE, S.A, Lousado (PT)

( * ) Notice: Subject to any disclaimer, the term of this patent is extended or adjusted under 35 U.S.C. 154(b) by 97 days.

(21) Appl. No.: 15/566,499

(22) PCT Filed: Apr. 11, 2016

(86) PCT No.: PCT/IB2016/052046
§ 371 (c)(1),
(2) Date: Oct. 13, 2017

(87) PCT Pub. No.: WO2016/198969
PCT Pub. Date: Dec. 15, 2016

(65) Prior Publication Data
US 2018/0302983 A1 Oct. 18, 2018

(30) Foreign Application Priority Data
Jun. 9, 2015 (PT) .......................... 108536

(51) Int. Cl.
D03D 15/00 (2006.01)
H05K 1/03 (2006.01)
(Continued)

(52) U.S. Cl.
CPC ............ H05K 1/038 (2013.01); G06F 3/044 (2013.01); H03K 17/962 (2013.01);
(Continued)

(58) Field of Classification Search
None
See application file for complete search history.

(56) References Cited

U.S. PATENT DOCUMENTS

| 6,773,129 B2 | 8/2004 | Anderson, Jr. |
| 7,719,007 B2 | 5/2010 | Tompkins |

(Continued)

FOREIGN PATENT DOCUMENTS

| EP | 1927825 A1 | 6/2008 |
| GB | 2396252 A | 6/2004 |

(Continued)

OTHER PUBLICATIONS

International Search Report and Written Opinion for International Application No. PCT/IB2016/052046 (14 Pages) (dated Aug. 4, 2016).

*Primary Examiner* — Carl Adams
(74) *Attorney, Agent, or Firm* — Luas & Mercanti, LLP (57) ABSTRACT

The present application describes the creation of a flexible textile structure with sensing and lighting capabilities without the loss of important features of a typical textile, for instance, comfort, seamless and mechanical flexibility. As sensing applications are described three different approaches that may or may not work together in the same system: a directly printed self-capacitive sensor, a knitted textile sensor and the integration of temperature/humidity bulk capaci- (Continued)

tive sensors directly on the textile. As lighting applications for decorative and signage purposes are used two different approaches that could work individually or together: an electroluminescent sensing device and the use of a hybrid sensor that includes the use of SMD LEDs and a printed self-capacitive sensor. The sensing and lighting applications previously described can be used, as an example, inside an automobile passenger compartment since they are easily integrated on seats with different geometries, armrests and central panels to substitute common mechanical buttons and sensing devices, and create a cleaner and seamless environment, following current tendencies in car interiors.

19 Claims, 4 Drawing Sheets

(51) Int. Cl.
    *H05K 1/16*     (2006.01)
    *H05K 3/32*     (2006.01)
    *H03K 17/96*     (2006.01)
    *G06F 3/044*     (2006.01)
    *H05K 3/46*     (2006.01)

(52) U.S. Cl.
    CPC ......... *H03K 17/9622* (2013.01); *H05K 1/162* (2013.01); *H05K 3/321* (2013.01); *H05K 3/4664* (2013.01); *G06F 2203/04102* (2013.01); *G06F 2203/04103* (2013.01); *H03K 2217/96078* (2013.01); *H05K 2201/029* (2013.01); *H05K 2201/0723* (2013.01); *H05K 2201/10015* (2013.01); *H05K 2201/10106* (2013.01); *H05K 2201/10151* (2013.01)

(56) References Cited

U.S. PATENT DOCUMENTS

| | | | |
|---|---|---|---|
| 8,044,665 B2 | 10/2011 | Joutsenoja et al. | |
| 8,952,610 B2 | 2/2015 | Rabe et al. | |
| 2002/0134116 A1* | 9/2002 | Sandbach | H01H 13/785 66/202 |
| 2004/0009729 A1* | 1/2004 | Hill | D03D 15/0066 442/208 |
| 2007/0040489 A1* | 2/2007 | Ray | G09G 3/30 313/310 |
| 2013/0250603 A1 | 9/2013 | Begriche | |
| 2017/0249033 A1* | 8/2017 | Podhajny | G06F 3/0445 |

FOREIGN PATENT DOCUMENTS

| | | | |
|---|---|---|---|
| WO | 2013063188 A1 | 5/2013 | |
| WO | 2014135958 A1 | 9/2014 | |
| WO | 2015022671 A1 | 2/2015 | |

\* cited by examiner

MULTIFUNCTIONAL TEXTILE SENSOR

CROSS REFERENCE TO RELATED APPLICATION

This Application is a 371 of PCT/IB2016/052046 filed on Apr. 11, 2016, which claims priority of Portuguese Application No. 108536 filed Jun. 9, 2015, both of which are incorporated herein by reference.

TECHNICAL DOMAIN

The present application describes a flexible textile structure with sensing and lighting capabilities without losing the principal features of a typical textile, such as comfort, seamless and mechanical flexibility.

PRIOR ART

The document WO2013063188A1 presents a method for producing a mutual capacitance touch sensor by flexographic printing and/or electroless plating and/or spray coating/deposition. The present touch sensor is composed by two different electrodes that are printed on each side of the dielectric substrate using one or two different inks from the following group: Copper, gold, nickel, tin and palladium, or alloys thereof. The technology now disclosed uses a different operation principal, typically named as self-capacitance, which allow the use of only one electrode and one type of ink, making the printing production steps easier and faster. The possibility of use different kind of printing technologies that do not involve the need of any kind of baths that could damage the substrate, as well as the use of different textiles structures as substrate makes this application different from the above mentioned document. Additionally, the possibility of use decorative lighting directly integrated on the printed self-capacitive sensor device without make any interference with their functionality is also a difference that should be considered.

The document U.S. Pat. No. 8,044,665B2 presents a method for producing a sensor product for electric field sensing in form of an array or matrix of electrically conductive areas and conductors that comprises the use of several layers attached to each other's. The use of different layers implies the use of different materials. This product is produced using technologies as etching, screen printing—including flat bed or rotary, gravure, offset, flexography, inkjet printing, electrostatography, electroplating and chemical plating. It is also mentioned the use of polyethylene terephthalate (PET), polypropylene (PP) or polyethylene (PE) as flexible substrate and the protective foil in form of nonwoven, fabric or foil, or a dielectric acrylic based coating. However, the use of only one electrode and one type of ink in the technology now disclosed makes the printing production steps of the device easier and faster. The possibility of using different kind of printing technologies that do not involve the need of any kind of steps that could damage the substrate, as well as the use of different textiles structures as substrate makes this application different from the one in the present document.

The document U.S. Pat. No. 7,719,007B2 presents the construction of a multilayer flexible electronic device having the functionalities of electroluminescent lighting and touch detection. It is a multilayer stacked structure wherein the capacitive sensor layers are built on top of electroluminescent device, requiring two electrodes and a dielectric layer between them, and one of its electrodes being shared with the electroluminescent device. The use of textiles is also only mentioned as a possible source of the dielectric layer necessary for the capacitive sensor or as a possible coating. In our application, the capacitive sensing system is independent and placed around the electroluminescent system, using only one electrode. This allows the production of a simpler and thinner final device that requires the application of fewer layers.

The document U.S. Pat. No. 6,773,129B2 presents a multilayer structure comprising a layer of textile on top of another substrate, such as foam, with an electroluminescent panel and touch switches disposed inside the multilayer structure. The disclosed electronic systems are of bulk nature and are simply placed inside the multilayer structure, whereas, in our application, the electronic devices are created using a textile substrate, and, as such, cannot be separated from said textile.

The document U.S. Pat. No. 8,952,610B2 presents the creation of an electroluminescent textile by printing an electroluminescent device directly on a textile substrate using screen printing technology. Although the application of the electroluminescent device is similar to the disclosed in this application, our technology involves the direct printing of a self-capacitive printed sensor onto the same textile substrate, that can be used to turn on or off the electroluminescent device.

The document EP1927825A1 presents a textile capacitive sensor electrode. The sensor includes a planar capacitive sensitive region for detecting electric field changes on the environment close to the surface of the electrode. The textile capacitive sensor comprises at least one fabric including electrically conductive carbon fibers arranged in such a way as to define the substantially planar capacitive sensitive region. The present application discloses a different process to produce the textile capacitive sensor. The document PT105517B presents electrodes based on textile substrates. This electrode is based on tubular knitted fabrics. The fabric disclosed in this application is made in an open way allowing the fabric to be adjusted to any format and solution. This versatility and complexity of the process allow us to create any kind of shape and to have the conductive yarn appearing only when needed without changing the yarn on the feeders or change the input. In the width of the fabric it is possible to do different shapes not only in the length. This flexibility textile knitted method ends in a textile self-capacitive sensor different from the one disclosed in the above mentioned document.

SUMMARY

The present application discloses a flexible textile structure with sensing and lighting capabilities without losing the principal features of a typical textile, such as comfort, seamless and mechanical flexibility. As sensing applications are described, in this application, three different approaches that include a directly printed self-capacitive sensor, a knitted textile sensor and the integration of temperature/humidity bulk capacitive sensor directly on the textile. As lighting applications for decorative and signage purposes are used two different approaches that include an electroluminescent sensing device and the use of a hybrid sensor associating a Surface Mount Device Light Emitting Diodes (SMD LEDs) and a printed self-capacitive sensor. The sensing device comprises a printed conductive electrode responsible for sensing and an outside printed conductive track that allows the control of the electric field around the sensor, and the incorporation of decorative red green blue (RGB) or single colour LEDs for lightning purposes. Several problems had to be overcome during the development of the disclosed textile, namely, the large open areas present in the textile web, which caused difficulties during the printing steps, and electric interferences caused by the electroluminescent device when the junction of the two technologies is necessary, that caused malfunctions of the capacitive sensor. These problems were resolved by filing the gaps in the textile web, through the application of a polymeric membrane layer or by printing a thick polymeric layer, and by printing a grounded conductive track element between the electroluminescent and the sensing device, respectively. The lighting device consists of an electroluminescent device composed of several layers printed directly onto a textile substrate. These layers may be composed of materials presenting different properties, such as, conductivity, electroluminescence and/or dielectric properties.

The use of a specific knitting textile structure typically called Jersey structure or double structures such as interlock, spacer and double faced, for the textile sensor production, allow the use of different mixtures of different yarns materials, which results in a functional and flexible self-capacitive sensor with the mechanical properties of a typical textile structure and the same touch comfort.

The use of hybrid solutions that included the use of printed conductive tracks connected to a conventional capacitive temperature/humidity sensor, with thicknesses between 0.6 and 0.8 mm on the back of the textile structure, allows the use of a lamination and/or heated press to fix the conventional devices to the textile structures without change the typical stability of these materials. Additionally is also a connection option the use of conductive yarns directly welded to the PCB that supports the capacitive temperature/humidity sensor.

It's possible to use the described multifunctional textile in every situation where a textile substrate is applied as a covering or coating for a physical structure, for example, a car seat, arm rest or central console.

The disclosed multifunctional textile structure permits the substitution of common mechanical buttons with signage reducing the visual noise and creating a cleaner environment, more in line with current tendencies.

As main characteristics, the present application describes a self-capacitive printed sensor that comprises:
Flexible substrate composed by different textiles materials with different structures constructions;
Printed conductive tracks that form the self-capacitive printed sensor which comprise materials with sheet resistance comprised between 10 and 60 mΩ/sq/mil;
Barrier polymeric layer for electrical and mechanical protection;
An electronic control system coupled to the textile structure for touch/proximity calibration and for electrical power supply.

In an embodiment, a textile material comprises the use of synthetic or natural fibers, such as polyethersulfone (PES), cotton (CO), polyamide (PA) or a mixture between these fibers.

In another embodiment, the textile comprises the use of a specific Jersey structure or double structures, such as interlock, spacer and double faced.

It is also disclosed in the present application the use of textile structure with a lower value of gaps in the textile web that allows the achievement of homogeneous printed conductive tracks.

In an embodiment, the elongation of the textile structure has a maximum of 30-40% in length and 60-70% across.

In another embodiment, a closed and flat structure has a shrinkage maximum value of 3 or 4%.

In even another embodiment, a polymeric membrane is used between the flexible textile structure and the printed tracks.

In an embodiment, the polymeric membrane is carried out in polyethylene terephthalate (PET) and/or Polyurethane (PU) and/or polyethylene naphthalate (PEN) Polyvinyl chloride (PVC) and/or thermoplastic polyolefin (TPO).

In another embodiment, the printed conductive tracks that form the self-capacitive sensor present lengths ranging between 10 and 300 mm.

In even another embodiment, the printed conductive track presents widths ranging between 200 μm and 3000 μm, forming the self-capacitance sensor.

In an embodiment, the distance between the printed conductive tracks is comprised between 200 μm and 10000 μm.

In another embodiment, the printed conductive track presents thicknesses between 20 μm and 500 μm, forming the self-capacitive sensor.

In even another embodiment the printed conductive tracks present a roughness between 20 and 100 nm.

In an embodiment the printed conductive tracks present an object detection sensibility between 0 and 20 mm of height.

In another embodiment the printed conductive tracks work only as an object and/or person detection.

In even another embodiment, the materials used in the printed conductive tracks of the self-capacitive sensor are silver and/or copper and/or aluminium and/or polymeric materials.

It is also disclosed in the present application, the method for printing on a sheet to sheet system, using screen printing and/or inkjet technology, on flexible substrates of the printed self-capacitive sensor device which comprises the following steps:
Elaboration of the digital design of the self-capacitive sensor that is intended to print;
Printing of the conductive material over the flexible textile substrate;
Thermal curing of the conductive material pattern at temperatures comprised between 80 and 140° C., for 10 to 20 minutes;
Placement of LEDs using pick & place system;
Dispensing of silver paste and/or a conductive adhesive to glue the LEDs to the printed sensor;
Thermal curing of the dispensed conductive material temperatures comprised between 80 and 140° C., for 10 to 20 minutes;
Lamination and/or coating of the polymeric barrier material.

It is also disclosed in the present application, the method for printing on a roll-to-roll system, using rotary screen printing technology and/or rotogravure, on flexible textiles substrates of the printed self-capacitive sensor device described that comprises the following steps:
Elaboration of the digital design of the self-capacitive sensor that is intended to print;
Printing of the conductive material at speeds comprised between 0.1 and 10 m/min over the flexible textile substrate;
Thermal curing of the conductive pattern at temperatures comprised between 80 and 140° C., at speeds comprised between 0.1 and 10 m/min;
Placement of LEDs using pick & place system;

Dispensing of silver paste and/or a conductive adhesive to glue the LEDs to the printed sensor;

Thermal curing of the dispensed conductive material temperatures comprised between 80 and 140° C., for 10 to 20 minutes;

Lamination and/or coating of the polymeric barrier material at speeds comprised between 0.1 and 10 m/min.

In an embodiment, a polymeric material is laminate on top of the textile before the printing steps in all the previously mentioned methods.

In another embodiment, the polymeric membrane is applied using a heated press.

In even another embodiment, the polymeric membrane is applied using a hot lamination system.

In an embodiment, the polymeric layer is applied using a coating technique, for example, slot die.

In another embodiment, the polymeric layer is applied using a printing technique, for example, screen printing.

In even another embodiment the printed self-capacitive sensor works as touch and/or proximity sensor.

In an embodiment, an electroluminescent device or LEDs are introduced into the textile substrate and used as lighting devices.

In another embodiment, one of the previously referred lighting devices is always used in conjunction with a self-capacitive sensor.

In even another embodiment, the electroluminescent device and self-capacitive sensor comprises thin conductive layers, electroluminescent and dielectric materials, applied using at least one printing and/or coating technique.

In an embodiment, an electromagnetic barrier is placed between the touch sensor and the electroluminescent device using printed conductive tracks.

In another embodiment, the printed conductive tracks that form the self-capacitive sensor and the electromagnetic barrier present lengths ranging between 10 and 300 mm.

In even another embodiment, the printed conductive tracks that form the self-capacitive sensor and electromagnetic barrier present widths ranging between 200 μm and 3000 μm.

In another embodiment, the distance between the printed conductive tracks and printed layers of the electroluminescent device is comprised between 200 μm and 10000 μm.

In even another embodiment, the printed conductive tracks that form the self-capacitive sensor and the electromagnetic barrier present thicknesses between 20 μm and 500 μm.

In an embodiment the printed conductive tracks present roughness between 20 and 100 nm.

In another embodiment the printed conductive tracks present an object detection sensibility between 0 and 20 mm of height.

In even another embodiment the printed conductive tracks works only as an object and/or person detection.

In an embodiment, the materials used in the printed conductive tracks of the self-capacitive sensor are silver and/or copper, and/or aluminium and/or conductive polymeric materials.

In another embodiment, the electroluminescent device couple with self-capacitive sensor is comprised of:

Printed conductive, electroluminescent and dielectric layers/tracks, with the conductive layers having sheet resistance comprised between 1 and 500 Ω/sq/mil and the dielectric layers having a dielectric constant between 3 and 20;

Barrier polymeric layer for electrical and mechanical protection;

An electronic control system coupled to the textile structure for touch/proximity calibration and for electrical power supply.

In even another embodiment, a transparent conductive layer is used as an electrode in the building of the electroluminescent device.

In an embodiment, the transparent conductive layer presents a thickness between 5 μm and 30 μm.

In another embodiment, the electroluminescent and dielectric layers present a thickness between 5 μm and 30 μm.

In even another embodiment, the electroluminescent and dielectric layers present a roughness between 10 and 500 nm.

In an embodiment, the transparent conductive layer possesses a transmittance between 60 and 90% on the visible region of the electromagnetic spectrum.

It is also disclosed in the present application, the method for printing on a sheet-to-sheet system, using screen printing and/or inkjet technology, of the electroluminescent device and associated self-capacitive sensor, which comprises the following steps:

Elaboration of the digital design of the self-capacitive sensor and the electroluminescent that is intended to print;

Printing of the transparent conductive material over the flexible textile substrate;

Thermal curing of the transparent conductive layer at temperatures comprised between 80 and 100° C., for 10 to 15 minutes;

Printing of the electroluminescent material over the transparent conductive layer;

Thermal curing of the electroluminescent layer at temperatures comprised between 100 and 150° C., for 10 to 15 minutes;

Printing of the dielectric material over the electroluminescent layer;

Thermal curing of the dielectric layer at temperatures comprised between 100 and 150° C., for 10 to 15 minutes;

Printing of a second dielectric material over the first dielectric layer;

Thermal curing of second dielectric layer at temperatures comprised between 100 and 150° C., for 10 to 15 minutes;

Printing of a conductive layer over the second dielectric layer and of conductive tracks over the flexible substrate;

Thermal curing of the conductive layer and tracks at temperatures comprised between 80 and 140° C., for 10 to 20 minutes;

Lamination and/or coating of the polymeric barrier material.

It is also disclosed in the present application, the method for printing on a roll-to-roll system, using rotary screen printing and/or rotogravure technology, of the electroluminescent device and associated capacitive self-sensor, which comprises the following steps:

Elaboration of the digital design of the self-capacitive sensor and the electroluminescent that is intended to print;

Printing of the transparent conductive material over the flexible textile substrate, at speeds comprised between 0.1 and 10 m/min over the flexible textile substrate;

Thermal curing of the transparent conductive layer at temperatures comprised between 80 and 100° C., at speeds comprised between 0.1 and 10 m/min;

Printing of the electroluminescent material over the transparent conductive layer;

Thermal curing of the electroluminescent layer at temperatures comprised between 100 and 150° C., for 10 to 15 minutes;

Printing of the dielectric material over the electroluminescent layer, at speeds comprised between 0.1 and 10 m/min;

Thermal curing of the dielectric layer at temperatures comprised between 100 and 150° C., at speeds comprised between 0.1 and 10 m/min;

Printing of a second dielectric material over the first dielectric layer, at speeds comprised between 0.1 and 10 m/min;

Thermal curing of second dielectric layer at temperatures comprised between 100 and 150° C., at speeds comprised between 0.1 and 10 m/min;

Printing of a conductive layer over the second dielectric layer and of conductive tracks over the flexible substrate, at speeds comprised between 0.1 and 10 m/min;

Thermal curing of the conductive layer and tracks at temperatures comprised between 80 and 140° C., at speeds comprised between 0.1 and 10 m/min;

Lamination and/or coating of the polymeric barrier material, at speeds comprised between 0.1 and 10 m/min.

In an embodiment, the LEDs and the temperature/humidity sensors integrated are bulk electronic devices.

In another embodiment, self-capacitive, temperature/humidity sensors are embedded into the textile substrate.

It is also disclosed in the present application, the use of the printed self-capacitive sensor for decorative lighting purposes in areas such as automotive and aeronautics industry, since the final multifunctional textile could be easily integrated on seats with different geometries, armrests and central panels.

It is also disclosed in the present application, the use of a knitted textile self-capacitive sensor that comprises the use of a specific Jersey structure or double structures, such as interlock, spacer and double faced.

In an embodiment, the textile sensor structure use a mix between PES/cotton (CO) and a conductive yarn forming an interlock structure.

In another embodiment, the proportion between PES/CO and conductive yarn are 2 ply's of PES Ne50 and 1 ply of stainless steel yarn used with 0.035 mm.

In even another embodiment, the conductive yarns are composed of a based Polyester yarn (70-85%) and Stainless Steel yarn (30-83%).

In an embodiment, the electrical resistance is between 10 to 20 ohm/meter.

In another embodiment the title yarn should be between 16 Nm and 60 Nm.

In even another embodiment, the knitted self-capacitive sensor is controlled by an electronic system.

In an embodiment, the electronic system is composed by a microcontroller (MCU), a sensor interface and a converter CC-CC with high noise immunity (EMI).

In another embodiment the temperature/humidity sensor is a single device that uses capacitive technology to measure these properties.

In even another embodiment, the temperature and humidity sensor is the HDC1000 model from Texas Instruments®, with I2C interface.

In an embodiment, the sensor is assembled to a support structure.

In another embodiment, the support structure is a printed circuit board with reduce thickness based on polyester or FR-4.

In even another embodiment, the support structure is interconnected to the textile structure.

In an embodiment, the interconnection is based on conductive printed tracks, adhesives and paints.

In another embodiment, the interconnection is based on conductive yarns.

General Description

The present application describes a multifunctional textile through the integration of lighting and sensing capabilities using innovative methods and technologies. The introduction of lighting capabilities is made possible by using two possible types of devices, namely, electroluminescent devices or LEDs. Through the use of different technologies, temperature, humidity, touch and proximity sensing capabilities are also introduced into a textile substrate. The multifunctional textile described in this application can be applied on various areas like automotive, aeronautic, medical, sports, military and others. On the automotive area, for example, the intelligent textile can be used in the vehicle interiors to operate as sensor-actuators located on the arm rest, gear console or on the seat. The sensor can perform functions such as opening or closing the window, opening the trunk, opening or blocking the fuel oil tank, among others. They can also be use as functional lighting or decorative lighting to indicate to the user position of the touch/proximity sensors.

To produce such a textile it was necessary to overcome difficulties related to the printing steps, due to the large open areas present in the web, and problems related to the placement of a capacitive printed sensor in close proximity to the electroluminescent device, due to the electric field interference that the sensor experienced when the electroluminescent was turned on. The mentioned problems related to the printing steps were overcome through the introduction of an optional primer polymeric layer, whose function was to fill the gaps in the textile web, reducing the open areas and preventing cracks and non-homogeneous thin printed tracks, or by increasing the number of printing operations for the first layers belonging to the electroluminescent device. To eliminate the electric field interference a conductive element was printed, and grounded, between the electroluminescent device and the capacitive printed sensor, introducing an electromagnetic barrier.

In relation to their structure and composition, the electroluminescent device and touch sensor comprises thin layers of conductive, electroluminescent and dielectric materials, applied using at least one printing and/or coating technique. The layers of conductive, electroluminescent and dielectric materials have between 5 and 60 μm of thickness. As for the LEDs and temperature/humidity sensors, these are bulk electronic devices. A self-capacity sensor is also created by the introduction of conductive wires during the knitting process of the textile substrate itself. This self-capacity sensor can be used as a touch/proximity sensor.

The touch sensors may be constructed and used in two possible forms.

In one embodiment, the touch sensor is composed of a single or double electrodes, with the possibility of placing LEDs, with typical SMD dimensions, on a printed conductive track placed around the touch sensor using a pick & place system. The LED's function is to help identify the location of the touch sensor and/or indicate its state, on or off, depending on the used electronic control system.

In another embodiment, the touch sensor is used in conjunction with the electroluminescent device and is placed around said device, consisting of a single printed electrode. In this case, the touch sensor is used to activate or deactivate the electroluminescent device, in the cases where said device has decorative functions, or, similar to the LEDs, the electroluminescent device is used to help identify the location of the touch sensor and/or indicate its state, on or off. Due to the fact that the electroluminescent device, when active, produced electric interferences on the touch sensor and caused its malfunction, an electromagnetic barrier was introduced between the electroluminescent device and the touch sensor, under the form of a grounded conductive track. In the case of touch sensor used in conjunction with SMD LEDs, the conductive track where the LEDs are placed can also function as a barrier that isolates the sensor from any outside interference.

The large open areas present in the web caused problems during the printing steps required for the touch sensors and electroluminescent device creation and to overcome these problems it was necessary to introduce an optional primer polymeric layer, whose function was to fill the gaps in the web, reducing the open areas and preventing cracks and non-homogeneous thin printed tracks, or to increase the number of printing operations for the first layers belonging to the electroluminescent device.

Figure 1:
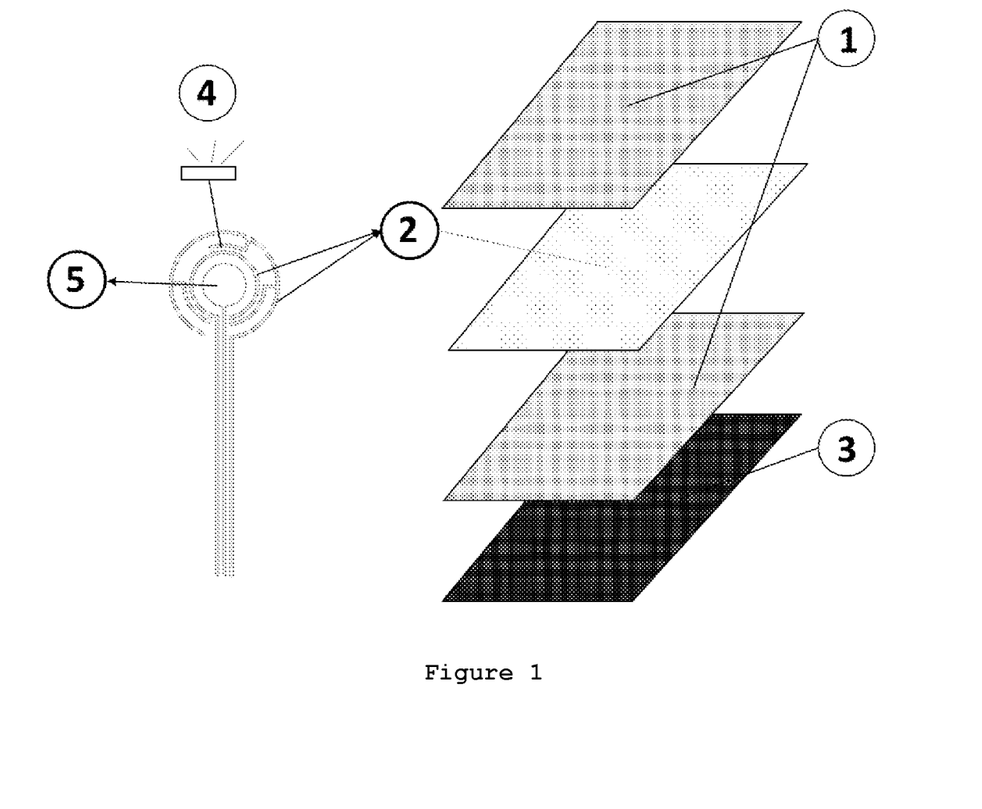
FIG. 1 illustrates a schematic representation of a printed self-capacitive sensor with embedded LEDs, where the reference numbers are related with:
1—Polymeric membranes;
2—Printed conductive tracks;
3—Textile substrate;
4—SMD LEDs;
5—Touch sensor.

The touch sensor, when used alone or with LEDs, is comprised of an optional support layer, printed conductive tracks, a barrier film for electrical and mechanical protection and an electronic control system coupled to the multi-structure for touch/proximity calibration and for electrical power. The conductive tracks can be printed using several different types of sheet-to-sheet or roll-to-roll systems, such as, screen printing, rotary screen printing, rotogravure and/or inkjet, and as for the barrier film, a heated press or a hot lamination system can be used for its application, as illustrated in FIG. 1.

Figure 2:
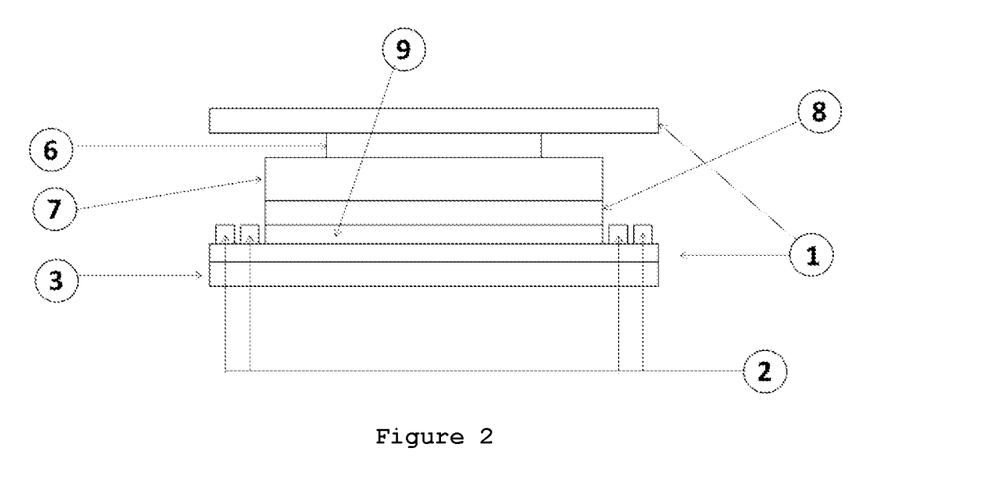
FIG. 2 illustrates a schematic representation of a printed electroluminescent device with self-capacitive sensors (cross-section), where the reference numbers are related with:
1—Polymeric membranes;
2—Printed conductive tracks;
3—Textile substrate;
6—Printed conductive layer;
7—Printed dielectric layer;
8—Printed electroluminescent layer;
9—Printed transparent conductive layer.
Figure 3:
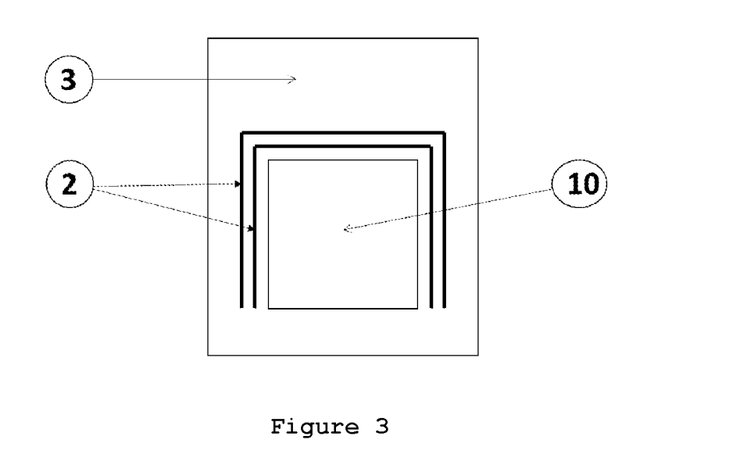
FIG. 3 illustrates a schematic representation of a printed electroluminescent device with self-capacitive sensors (top-view), where the reference numbers are related with:
2—Printed conductive tracks;
3—Textile substrate;
10—Printed electroluminescent device.

The electroluminescent device coupled with a touch sensor is comprised of, starting from the textile substrate, an optional support layer, deposited using a heated press or a hot lamination system, a first transparent conductive layer, an electroluminescent layer, a dielectric layer, a second conductive layer, two conductive printed elements with sensing and electromagnetic shielding properties, a barrier film for electrical and mechanical protection and an electronic control system coupled to the multi-structure for electrical power. The method for printing the electroluminescent device and associated capacitive sensor comprises several alternating printing and thermal curing steps with a final laminating step, as illustrated in FIGS. 2 and 3.

The capacitive sensors described in the present application are named as self-capacitance and they operate based in the electronics controls continuously measuring the current on each electrode to the ground in order to establish a steady-state current. When a finger or an object approaches the sensor a change occurs in the electric field, increasing the current drawn as it creates a path do the ground. The dimensioning of the printed conductive tracks of the self-capacitive sensor enables the calibration of the sensor for obtaining different ranges of sensibility, operating voltages and currents. Thus, the self-capacitive sensor is able to have different geometries presenting different advantages, like the possibility of using this kind of technology in different three-dimensional objects without loss of their touch/proximity sensibility, mechanical stability and electrical percolation. Another advantage is the possibility of achieving an ideal combination between the widths and thicknesses of the printed conductive tracks, associated to the correct dimensioning of the electronic controls depending of the final product where the textile will be adapted.

The textile substrates where the printed electronic devices are applied can present a Jersey structures or double structures such as interlock, spacer or double faced. These Jersey structures allow the creation of a textile structure with a closed loop. The substrates can be created using synthetic or natural fibres, such as, polyethersulfone (PES), cotton (CO), polyamide (PA) and mixtures between these fibres.

Figure 4:
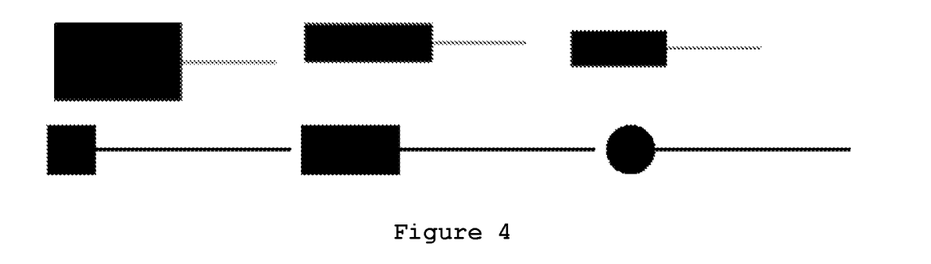
FIG. 4 illustrates a schematic representation of possible geometries for the textile sensor.

As for the knitted self-capacitive sensor, it uses an interlock structure and its production is conducted on an electronic knitting machine. This sensing textile substrate is knitted with a mix between PES/CO and the conductive yarn and the knitted sensors may present different geometries and dimensions, as illustrated in FIG. 4. It operates like a field effect sensor, when the user enters or approximate to field, it detects the change and indicates an event has occurred with a corresponding output signal. The input stimulus to the field in this case can be the human body or an object.

The problems identified for this specific knitting application are related to the maintenance of the mechanical stability of the complete textile structure, the maintenance of the same touch comfort for the end users, since the use of metallic yarns causes some comfort changes related to the cold sensation of the metal, and the connections between the knitted sensor and the electronic control system. The use of a specific knitting textile structure typically called as Jersey structure, that allow the use of different mixtures of yarns of different materials, results in a functional and flexible sensor with the mechanical properties of a typical textile structure and the same touch comfort.

Figure 5:
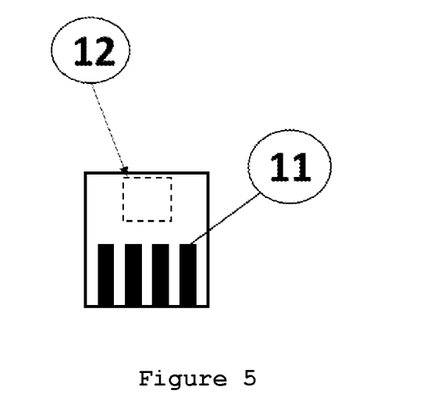
FIG. 5 illustrates a schematic representation of the PCB support structure used with printed conductive tracks on temperature/humidity sensor, where the reference numbers are related with:
11—Conductive pads;
12—Temperature/Humidity sensor.
Figure 6:
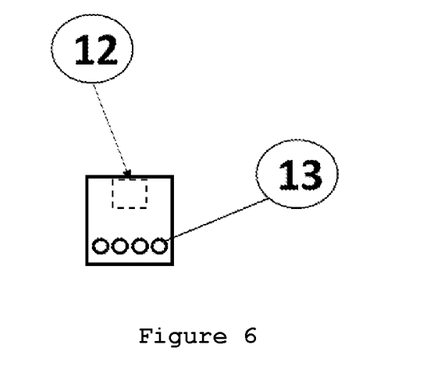
FIG. 6 illustrates a schematic representation of the PCB support structure used with printed conductive wires on temperature/humidity sensor, where the reference numbers are related with:
12—Temperature/Humidity sensor;
13—Holes for wires connections.

Temperature and relative humidity sensing capabilities are achieved using a digital sensor with I2C interface, for example model HDC1000 by Texas Instruments®, which uses a capacitive technology to measure the above mentioned parameters, avoiding the need of perforation on the textile substrate. The sensor is integrated into the textile substrate in two stages. In the first stage, the sensor is assembled in a support structure, preferably a printed circuit board with reduced thickness (0.6 to 0.8 mm) based on polyester or FR-4, in order to increase the mechanical robustness of the structure. In a second stage the previous assembled structure is interconnected with the textile using two possible pathways, namely through silver printed conductive tracks or by textile conductive tracks. In the first approach, illustrated in FIG. 5, the connection is based on a support structure with metal pads (SMT) that allow the electric contact with the conductive tracks, using adhesives or conductive inks. Using textile conductive tracks, the interconnection method uses an associated supporting structure based on metallized holes, as illustrated in FIG. 6, which serve to support lead wire ends that are attached through these holes. It is further added a thin layer of epoxy in order to improve the fixing of wires to the frame.

The main problem related to the use of the bulk temperature and humidity sensor was the embedding of such bulk directly on the textile structures without significant changes on the visible textile surface. The use of hybrid solutions that included the use of printed conductive tracks connected to a very thin conventional capacitive temperature/humidity sensor on the back of the textile structure allowed the use of a lamination and/or heated press to fix the conventional devices to the textile structures without producing changes in the typical stability of these materials.

Figure 7:
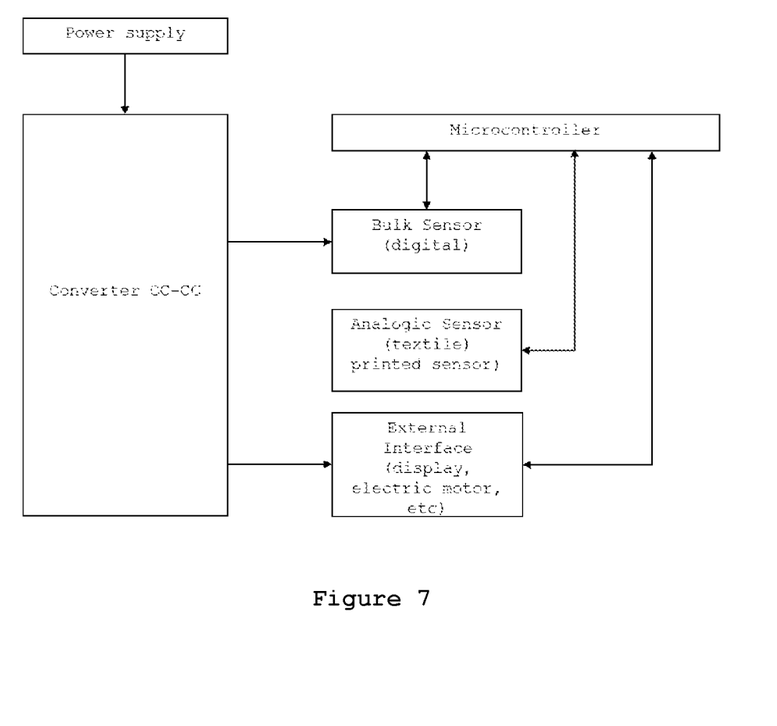
FIG. 7 illustrates an electronic system architecture.

All of the electronic devices referred in this application use the same electronic control system, where the output signal is received by a compact electronic circuit and sent to the correspondent actuator systems. The electronic system is composed by a microcontroller (MCU); sensor interface; converter CC-CC with high noise immunity (EMI) like the architecture represented on FIG. 7.

As sensing applications are described three different approaches that may or may not work together in the same system: a directly printed self-capacitive sensor, a knitted textile sensor and the integration of temperature/humidity bulk capacitive sensor directly on the textile. As lighting applications for decorative and signage purposes are used two different approaches that may or may not work together: an electroluminescent sensing device and the use of a hybrid sensor that include the use of SMD LEDs and a printed self-capacitive sensor.

The present application uses electrical conductive yarns knitted simultaneously with different materials that are part of the textile structure, for the sensor production. The materials used in the present application as conductive wires are copper and/or stainless steel and/or silver and/or tungsten and/or molybdenum with diameters between 25 and 150 µm. The use of inorganic conductive materials on the construction of the present textile capacitive sensor and the possibility of knitting the textile sensor and textile structure together, guarantees the possibility of maintain the comfort, seamless and mechanical flexibility of the textile structure.

BRIEF DESCRIPTION OF FIGURES

For easier understanding of this application, figures are attached in the annex that represent different embodiments which nevertheless are not intended to limit the technology disclosed herein.

DESCRIPTION OF EMBODIMENTS

The present application describes a multifunctional textile that comprises the integration of lighting and sensing capabilities using innovative methods and technologies. The introduction of lighting capabilities is made possible by using two possible types of devices, namely, electroluminescent devices or LEDs. Through the use of different technologies, temperature, humidity, touch and proximity sensing capabilities are also introduced into a textile substrate.

In relation to their structure and composition, the electroluminescent device and touch sensor comprising thin layers of conductive, electroluminescent and dielectric materials, applied using at least one printing and/or coating technique. As for the LEDs and temperature and humidity sensors, these are bulk electronic devices. A self-capacitive sensor was also created by the introduction of conductive wires during the knitting process of the textile substrate itself.

The touch sensors may be constructed and used in two possible forms. In one embodiment, the touch sensor is composed of a single electrode, with the possibility of placing LEDs, with typical SMD dimensions, on a printed conductive track placed around the touch sensor using a pick & place system. The LED's function is to help identify the location of the touch sensor and/or indicate its state, on or off, depending on the used electronic control system.

In another embodiment, the touch sensor is used in conjunction with the electroluminescent device and is placed around said device, comprising a single printed electrode. In this case, the touch sensor is used to activate or deactivate the electroluminescent device, in the cases where said device has decorative functions, or, similar to the LEDs, the electroluminescent device is used to help identify the location of the touch sensor and/or indicate its state, on or off. Due to the fact that the electroluminescent device, when active, produced electric interferences on the touch sensor and caused its malfunction, an electromagnetic barrier was introduced between the electroluminescent device and the touch sensor, under the form of a grounded conductive track.

The touch sensor, when used alone or with LEDs, is comprised of an optional support layer, printed conductive tracks with sheet resistance comprised between 10 and 60 mΩ/sq/mil, a barrier film for electrical and mechanical protection and an electronic control system coupled to the multi-structure for touch/proximity calibration and for electrical power. The printed conductive tracks present lengths and widths ranging between 10-300 mm and 200-300 µm, respectively, and the distance between the printed conductive tracks and layers is comprised between 200 µm and 10000 µm. They also present a thickness between 20 µm and 500 µm, and a roughness between 20 and 100 nm. In terms of object detection sensibility, they can detect the approach of an object, for example, a finger, at a distance of up to 20 mm.

The optional support layer may be composed of, for example, polyethylene terephthalate (PET), and/or Polyurethane (PU), and/or polyethylene naphthalate (PEN), Polyvinyl chloride (PVC) and/or thermoplastic polyolefin (TPO). As for its deposition, it can be done using a heated press or a hot lamination system.

Several materials can be used in the creation of the printed conductive tracks, namely, silver, copper, aluminium and/or polymeric materials. These materials can be applied using several different types of sheet-to-sheet or roll-to-roll systems, such as, screen printing, rotary screen printing, rotogravure and/or inkjet.

When the touch sensors are printed using screen printing or inkjet, their method of production comprise the following steps:
- Elaboration of the digital design of the self-capacitive sensor that is intended to print;
- Printing of the conductive material over the flexible textile substrate;
- Thermal curing of the conductive material pattern at temperatures comprised between 80 and 140° C., for 10 to 20 minutes;
- Placement of the LEDs using a pick & place system;
- Dispensing of silver paste and/or a conductive adhesive to glue the LEDs to the printed sensor;
- Thermal curing of the conductive adhesives or inks at temperatures comprised between 80 and 140° C., for 10 to 20 minutes;
- Lamination and/or coating of the polymeric barrier material.

When the chosen techniques are rotary screen printing or rotogravure, the touch sensors are printed accordingly to the following steps:
- Printing of the conductive material at speeds comprised between 0.1 and 10 m/min over the flexible textile substrate;
- Thermal curing of the conductive pattern at temperatures comprised between 80 and 140° C., at speeds comprised between 0.1 and 10 m/min;
- Placement of the LEDs using a pick & place system;
- Dispensing of silver paste and/or a conductive adhesive to glue the LEDs to the printed sensor;
- Thermal curing of the conductive adhesives or inks at temperatures comprised between 80 and 140° C., for 10 to 20 minutes;
- Lamination and/or coating of the polymeric barrier material at speeds comprised between 0.1 and 10 m/min.

The electroluminescent device coupled with a touch sensor comprises, starting from the textile substrate:
- An optional support layer. This layer may be composed of, for example, polyethylene terephthalate (PET), and/or Polyurethane (PU), and/or polyethylene naphthalate (PEN), Polyvinyl chloride (PVC) and/or thermoplastic polyolefin (TPO). As for its deposition, it can be done using a heated press or a hot lamination system;
- A first transparent conductive layer. This layer has a sheet resistance comprised between 100 and 500 Ω/sq/mil, a transmittance between 60 and 90% on the visible region and a thickness between 5 and 15 µm;
- An electroluminescent layer. This layer has thickness between 5 and 30 µm and a roughness between 10 and 500 nm;
- A dielectric layer. This layer has a thickness between 10 and 60 µm, a dielectric constant between 3 and 20 and a roughness between 10 and 500 nm;
- A second conductive layer, with a sheet resistance comprised between 10 and 60 mΩ/sq/mil, a thickness between 5 µm and 50 µm, and a roughness between 20 nm and 100 nm;
- Two conductive printed elements with sensing and electromagnetic shielding properties, with sheet resistance comprised between 10 and 60 mΩ/sq/mil, lengths and widths ranging between 10-300 mm and 200-300 µm, respectively, and a distance between the printed conductive elements and the transparent conductive layer between 200 µm and 10000 µm. They also present a thickness between 5 µm and 50 µm, and a roughness between 20 and 100 nm;
- A barrier film for electrical and mechanical protection, made of the same materials as the optional support layer;
- An electronic control system coupled to the multi-structure for electrical power.

A method for printing the electroluminescent device and associated capacitive sensor on a sheet to sheet system, using screen printing technology and/or inkjet technology, comprises the following steps:
- Printing of the transparent conductive material over the flexible textile substrate;
- Thermal curing of the transparent conductive layer at temperatures comprised between 80 and 100° C., for 10 to 15 minutes;
- Printing of the electroluminescent material over the transparent conductive layer;
- Thermal curing of the electroluminescent layer at temperatures comprised between 100 and 150° C., for 10 to 15 minutes;
- Printing of the dielectric material over the electroluminescent layer;
- Thermal curing of the dielectric layer at temperatures comprised between 100 and 150° C., for 10 to 15 minutes;
- Printing of a second dielectric material over the first dielectric layer;
- Thermal curing of second dielectric layer at temperatures comprised between 100 and 150° C., for 10 to 15 minutes;
- Printing of a conductive layer over the second dielectric layer and of conductive tracks over the flexible substrate;
- Thermal curing of the conductive layer and tracks at temperatures comprised between 80 and 140° C., for 10 to 20 minutes;
- Lamination and/or coating of the polymeric barrier material.

The textile substrates where the printed electronic devices are applied can present a Jersey structures or double structures such as interlock, spacer or double faced. The elongation of these substrates must be a maximum of 30-40% in length and 60-70% across. A closed and flat structure is needed, and shrinkage values should not exceed 3-4%. The substrates can be created using synthetic or natural fibres, such as, polyethersulfone (PES), cotton (CO), polyamide (PA) and mixtures between these fibres.

Temperature and relative humidity sensing capabilities are achieved using a digital sensor with I2C interface, for example model HDC1000 by Texas Instruments®, which uses a capacitive technology to measure the mentioned parameters. The sensor is integrated into the textile substrate in two stages. In the first stage, the sensor is placed assembled in a support structure, preferably a printed circuit board with thickness between 0.6-0.8 mm based on polyester or FR-4, in order to increase the mechanical robustness of the structure. In a second stage, the previous assembled structure is interconnected with the textile using two possible methods:

Through silver based conductive tracks previously printed in the textile. This method uses an associated supporting structure based on metallized pads (SMT), which carry the electrical contact to the raceways via conductive adhesives and paints. The mentioned conductive tracks have sheet resistance comprised between 10 and 60 mΩ/sq/mil, lengths and widths ranging between 10-300 mm and 200-300 µm, respectively, and a distance between the printed conductive elements and the transparent conductive layer between 200 µm and 10000 µm. They also present a thickness between 5 µm and 50 µm, and a roughness between 20 and 100 nm;

Through conductive yarns. This method uses an associated supporting structure based on metallized holes, which serve to support lead wire ends that are attached through these holes. It is further added a thin layer of epoxy in order to improve the fixing of wires to the frame. The conductive yarns are composed of a based Polyester yarn (70-85%) and Stainless Steel yarn (30-83%), their resistance between 10 to 20 ohm/meter and the title of the yarn should between Ne16 and Ne 60.

As for the knitted self-capacitive sensor, it uses an interlock structure and in its production is conducted on an electronic knitting machine. This sensing textile substrate is knitted with a mix between PES/CO and the conductive yarn, in the following proportions, 2 ply's of PES Ne 50 and 1 ply of Inox yarn used in 0.035 mm. The conductive yarns are composed of a based Polyester yarn (70-85%) and Stainless Steel yarn (30-83%), their resistance between 10 to 20 ohm/meter and the title of the yarn should between Nm 16 and Nm 60. The numbers of needles working on the developed structures were 1800X2, divided with 1800 in the cylinder and 1800 in the disc.

The knitted self-capacitive sensor, as well as the temperature and relative humidity sensor, is controlled by an electronic system composed by a microcontroller (MCU); sensor interface and a converter CC-CC with high noise immunity (EMI).

Best Modes

Example of the Application of an Electroluminescent Device with an Integrated Touch Sensor A PES/CO textile substrate was used as the base material. A copolyester web membrane (9B8, from Protechnic) was applied on the reverse side of the textile substrate using a heated press, applying 130° C. and 3 bar of pressure during 15 seconds. A transparent conductive layer was then applied on top of the membrane using a synthetic polymer-based 3,4-polyethylenedioxithiophene (PEDOT) dispersion (Clevios SV3, from Heraeus) over an area of 3×3 cm, and subsequently cured at 100° C. during 10 min. This was followed by the application of an electroluminescent paste (LuxPrint 8150B, from DuPont) on top of the previous conductive layer over an area of 2×2 cm, and subsequently curing at 100° C. during 15 min. Two layers of a dielectric paste (LuxPrint 8153, from DuPont) were then printed on top of the previous layer, completely covering it, and cured at 130° C. during 15 min, after each layer was printed. A silver based paste (PE871, from DuPont) was then used to print a previously chosen design on top of the dielectric layers and two conductive lines surrounding the first transparent conductive layer but not contacting it. These were cured applying 130° C. during 15 min. A distance of 1 mm was left between each conductive lines and the silver layer printed on top of the dielectric layer. Each printing step was conducted using a screen printing equipment model RP 2.2, from RokuPrint, and a screen with a 230 polyester mesh. In the curing steps a box oven was used. Finally, a copolyester film membrane (92M, Protechnic) was applied in top of the previously printed layers using a heated press, applying 150° C. and 3 bar of pressure during 15 seconds.

Example of the Application of an Integrated Touch Sensor

A PES/CO textile substrate was used as the base material. A copolyester web membrane (9B8, from Protechnic) was applied on the reverse side of the textile substrate using a heated press, applying 130° C. and 3 bar of pressure during 15 seconds. A silver based paste (PE871, from DuPont) was then used to print a previously chosen design of the self-capacitive sensor on top of the web membrane and two conductive lines surrounding the first sensor that allow the posteriorly parallel electric connection of the SMD LEDs using a pick & place system. The silver pastes were cured applying 100° C. during 15 min. A distance of 2 mm was left between each conductive tracks. Each printing step was conducted using a screen printing equipment model RP 2.2, from RokuPrint, and a screen with a 230 polyester mesh. In the curing steps a box oven was used. Finally, a copolyester film membrane (92M, Protechnic) was applied in top of the previously printed layers using a heated press, applying 150° C. and 3 bar of pressure during 15 seconds.

Example of a Knitted Textile Sensor

A textile substrate with a knitted self-capacitive textile sensor was produced by an electronic knitting machine by Mayer & Cie. The machine used a mixture of PES/CO and conductive yarn (Stainless steel—316L from Chori), built by 2 plys of PES and 1 ply of Inox yarn with 0.035 mm. An interlock regular structure was knitted, using the previously mentioned knitting machine, with the conductive yarn only appearing in the sensor area and creating a rectangular shape with 15×5 cm and a 5 mm thickness. The geometry is developed on associated software and then transferred to the machine where the needles receive an electrical input and work only when needed. Due to the fact that the structure requires working with special yarns the speed of production was 16 rpm. On a conductive track a metallic crimp was applied to allow the connection to the electronic circuit through the soldering manual process. The electronic circuit is composed by a microcontroller (MCU); sensor interface; converter CC-CC with high noise immunity (EMI). These components were assembled on a small and compact printed circuit board to allow the system miniaturization.

This description is of course not in any way restricted to the embodiments presented herein and any person with an average knowledge of the area can provide many possibilities for modification thereof without departing from the general idea as defined by the claims. The embodiments described above can obviously be combined with each other. The following claims further define different embodiments.

Lisbon, Jun. 9, 2015

The invention claimed is:

1. A multifunctional textile sensor, knitted in a textile structure comprising:
   knitted conductive yarns forming a knitted self-capacitive sensor;
   one or more printed self-capacitive sensors;
   a printed electroluminescent device;
   one or more printed conductive tracks disposed between the printed electroluminescent device and the one or more printed self-capacitive sensors, wherein the one or more printed conductive tracks are not in contact with the printed electroluminescent device and not in contact with the one or more printed self-capacitive sensors; and a polymeric membrane between the textile structure and the printed conductive tracks, printed self-capacitive sensor and printed electroluminescent device;

wherein the one or more printed conductive tracks are grounded, creating an electromagnetic barrier placed between the self-capacitive sensor and the electroluminescent device.

2. The multifunctional textile sensor according to claim 1, wherein the knitted self-capacitive sensor comprises Jersey structure or double structures.

3. The multifunctional textile sensor according to claim 2, wherein the Jersey structure or double structures are interlock, spacer and double faced structures.

4. The multifunctional textile sensor according to claim 1, wherein a conductive yarn is used to create the knitted self-capacitive sensor.

5. The multifunctional textile sensor according to claim 1, wherein the one or more printed conductive tracks are connected to a very thin conventional capacitive temperature/humidity sensor, with thicknesses between 0.6 and 0.8 mm, on the back of the textile structure.

6. The multifunctional textile sensor according to claim 1, wherein the knitted conductive yarns are directly welded to a printed circuit board that supports a capacitive temperature/humidity sensor.

7. The multifunctional textile sensor according to claim 1, further comprising printed self-capacitive sensors that comprise at least one of single electrodes or double electrodes.

8. The multifunctional textile sensor according to claim 1, wherein the one or more printed self-capacitive sensor is formed by printed tracks with sheet resistance of between 10 and 60 mΩ/sq/mil.

9. The multifunctional textile sensor according to claim 1, wherein the textile structure comprises knitted conductive yarns and comprises the use of polyethersulfone, or cotton, or polyamide.

10. The multifunctional textile sensor according to claim 1, wherein the knitted conductive yarns comprise one of a Jersey structure and double structures.

11. The multifunctional textile sensor according to claim 1, comprising a printed self-capacitive sensor, in conjunction with the electroluminescent device placed around said device, comprising a single printed electrode.

12. The multifunctional textile sensor according to claim 1, wherein the one or more printed self-capacitive sensors comprise a support layer, printed conductive tracks, a barrier film for electrical and mechanical protection and an electronic control system coupled to a multi-structure for touch/proximity calibration and for electrical power.

13. The multifunctional textile sensor according to claim 1, further comprising the textile structure knitted with a mix of polyethersulfone/cotton.

14. The multifunctional textile sensor according to claim 1, further comprising a microcontroller, a sensor interface and a DC-AC converter with high noise immunity.

15. The multifunctional textile sensor according to claim 1, wherein the electroluminescent device comprises
one or more printed conductive layers;
one or more printed transparent conductive layers;
one or more printed luminescent layers;
one or more printed dielectric layers; and
one or more polymeric membranes
wherein
the printed conductive layers have a sheet resistance between 1 and 500 Ω/sq/mil,
the printed dielectric layers have a dielectric constant between 3 and 20,
the printed transparent conductive layer (9) have a transmittance between 60% and 90% on the visible region of the electromagnetic spectrum;
the polymeric membrane provides electrical and mechanical protection, and comprises the use of polyethylene terephthalate (PET), or polyurethane (PU), or polyethylene naphthalate (PEN), or polyvinyl chloride (PVC) or thermoplastic polyolefin (TPO); and
an electronic control system coupled to the textile structure for touch/proximity calibration and for electrical power supply.

16. The multifunctional textile sensor according to claim 1, further comprising a touch sensor, wherein an electromagnetic barrier is placed between the touch sensor and the electroluminescent device using grounded printed conductive tracks.

17. A method of printing, on a sheet to sheet system, using at least one of screen printing and inkjet technology, and flexible substrates, the printed self-capacitive sensor used in the multifunctional textile sensor of claim 1, the method comprising the following steps:
elaborating a digital design of the self-capacitive sensor;
printing a conductive material over a flexible textile substrate;
thermally curing the conductive material pattern at temperatures comprised between 80 and 140° C., for 10 to 20 minutes;
placing LEDs comprising a pick and place system;
displacing a conductive material to glue the LEDs to the printed sensor;
thermally curing of the conductive material at temperatures of between 80 and 140° C., for 10 to 20 minutes; and
performing at least one of laminating and coating a polymeric barrier material.

18. A method of printing, on a roll-to-roll system, using at least one of rotary screen printing technology and rotogravure, and flexible substrate, the printed self-capacitive sensor used in the multifunctional textile sensor of claim 1, the method comprising the following steps:
elaborating a digital design of the self-capacitive sensor;
printing a conductive material at speeds of between 0.1 and 10 m/min over a flexible textile substrate;
thermally curing the conductive material at temperatures of between 80 and 140° C., at speeds of between 0.1 and 10 m/min;
placing LEDs using pick and place system;
dispensing a conductive material to glue the LEDs to the printed sensor;
thermally curing the conductive material at temperatures of between 80 and 140° C., for 10 to 20 minutes;
performing at least one of laminating and coating a polymeric barrier material at speeds of between 0.1 and 10 m/min.

19. A method of printing the electroluminescent device and associated capacitive sensor of the multifunctional textile sensor of claim 1 on a sheet to sheet system, using at least one of screen printing technology and inkjet technology, the method comprising the following steps:
printing a transparent conductive material over a flexible textile substrate;
thermally curing a transparent conductive layer at temperatures of between 80 and 100° C., for 10 to 15 minutes;
printing an electroluminescent material over the transparent conductive layer to form an electroluminescent layer;

thermally curing the electroluminescent layer at temperatures of between 100 and 150° C., for 10 to 15 minutes;

printing a first dielectric material over the electroluminescent layer to form a first dielectric layer;

thermally curing the first dielectric layer at temperatures of between 100 and 150° C., for 10 to 15 minutes;

printing a second dielectric material over the first dielectric layer to form a second dielectric layer;

thermally curing the second dielectric layer at temperatures of between 100 and 150° C., for 10 to 15 minutes;

printing a second conductive layer over the second dielectric layer and one or more printed conductive tracks over the flexible textile substrate;

thermally curing the second conductive layer and one or more printed conductive tracks at temperatures of between 80 and 140° C., for 10 to 20 minutes; and performing at least one of coating a polymeric barrier material.

\* \* \* \* \*